United States Patent [19]

Suzuki et al.

[11] Patent Number: 5,283,565
[45] Date of Patent: Feb. 1, 1994

[54] MULTIMODE INPUT CIRCUIT RECEIVING TWO SIGNALS HAVING AMPLITUDE VARIATIONS DIFFERENT FROM EACH OTHER

[75] Inventors: Satoshi Suzuki, Yokohama; Isao Abe, Kawasaki both of Japan

[73] Assignee: Kabushiki Kaisha Toshiba, Kawasaki, Japan

[21] Appl. No.: 939,708

[22] Filed: Sep. 2, 1992

[30] Foreign Application Priority Data

Sep. 3, 1991 [JP] Japan .................................. 3-222886

[51] Int. Cl.⁵ ........................... G09G 3/36; H03K 3/01
[52] U.S. Cl. ..................................... 345/98; 307/475; 307/270; 307/585; 345/211
[58] Field of Search ....................... 340/784, 811, 813; 307/475, 270, 243, 468, 469, 242, 571, 585

[56] References Cited

U.S. PATENT DOCUMENTS 4,070,600 1/1978 Butler et al. .................... 307/475 X
5,165,046 11/1992 Hesson .............................. 307/270

Primary Examiner—Ulysses Weldon
Assistant Examiner—Kara Farnandez
Attorney, Agent, or Firm—Oblon, Spivak, McClelland, Maier & Neustadt

[57] ABSTRACT

A multimode input circuit comprises a input terminal, first outputting circuit including a buffer circuit, for receiving a first signal having a first amplitude variation via the input terminal and outputting the first signal of a preset potential; second outputting circuit for receiving a second signal having a second amplitude variation different from the first amplitude variation via the input terminal and outputting a third signal of a preset potential, the second outputting circuit including a power source supplying terminal for supplying the same potential as the maximum potential of the second signal, a first FET having a source connected to said power source supplying terminal, a gate supplied with a selection signal for specifying one of the input signals to be selected by the multimode input circuit and a drain, and a second FET formed to make a complementary structure together with the first FET and having a drain connected to the drain of the first FET, a gate connected to the input terminal and a source connected to a circuit ground, and selecting circuit for receiving the first and third signals from the first and second outputting circuit and a selection signal from the exterior and selecting and outputting one of the first and third signals according to the state of the selection signal.

7 Claims, 4 Drawing Sheets

MULTIMODE INPUT CIRCUIT RECEIVING TWO SIGNALS HAVING AMPLITUDE VARIATIONS DIFFERENT FROM EACH OTHER

BACKGROUND OF THE INVENTION

1. Field of the Invention

This invention relates to a multimode input circuit formed in a liquid crystal display (LCD) driving integrated circuit, for example, and more particularly to a multimode input circuit for receiving two signals having amplitude variations different from each other, converting the received signal into a preset potential and supplying the converted potential to an internal circuit of the integrated circuit.

2. Description of the Related Art

An LCD data driving integrated circuit (IC) for serially receiving LCD display data inputs, converting them into the parallel form, converting them into LCD driving voltages and then outputting the driving voltages may be sometimes divided into plural sections which are arranged in the horizontal direction of the LCD panel. With the above arrangement, in a case where a plurality of data driving ICs are cascade-connected to serially transfer LCD display data inputs, the signal level of the display data input to the first-stage data driving IC and the signal level of the display data input to one of the succeeding stage data driving ICs are different from each other, and respectively set to 12 V and 5 V, for example. That is, as the input signal to the data driving ICs, a first input signal (for example, 12 V system) having an amplitude varying in a range between a first reference potential and a first power source potential and a second input signal (for example, 5 V system) having an amplitude varying in a range between a second reference potential and a second power source potential may be used.

Therefore, at the time of design, it is necessary to form circuit patterns for the input circuits having different circuit constructions for the signals having two different amplitude variations.

SUMMARY OF THE INVENTION

An object of this invention is to provide a multimode input circuit which can deal with a plurality of signals respectively having different amplitude variations and which can be formed in a relatively small area.

The above object can be attained by a multimode input circuit comprising an input terminal, first outputting means including a buffer circuit, for receiving a first signal having a first amplitude variation via the input terminal and outputting the first signal of a preset potential, second outputting means for receiving a second signal having a second amplitude variation different from the first amplitude variation via the input terminal and outputting a third signal of a preset potential, the second outputting means including a power source supplying terminal for supplying the same potential as the maximum potential of the second signal, a first FET having a source connected to the power source supplying terminal, a gate supplied with a selection signal for specifying one of the input signals to be selected by the multimode input circuit and a drain, and a second FET formed to make a complementary structure together with the first FET and having a drain connected to the drain of the first FET, a gate connected to the input terminal and a source connected to a circuit ground, and selecting means for receiving the first and third signals from the first and second outputting means and a selection signal from the exterior and selecting and outputting one of the first and third signals according to the state of the selection signal.

With the above construction, in this invention, only one of the two signals which are received and have different amplitude variations can be selected according to the selection signal for specifying one of the received signals to be selected and can be output to the exterior. In this case, in the circuit constructing the second outputting means, a complementary CMOS is constructed and whether the second signal is output or not is determined by use of the first FET in response to the selection signal, and no other FET which is switched by the selection signal is provided. Therefore, a multimode input circuit which can be formed in a relatively small area can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

There will now be described an embodiment of this invention in detail with reference to the accompanying drawings.

Figure 3:
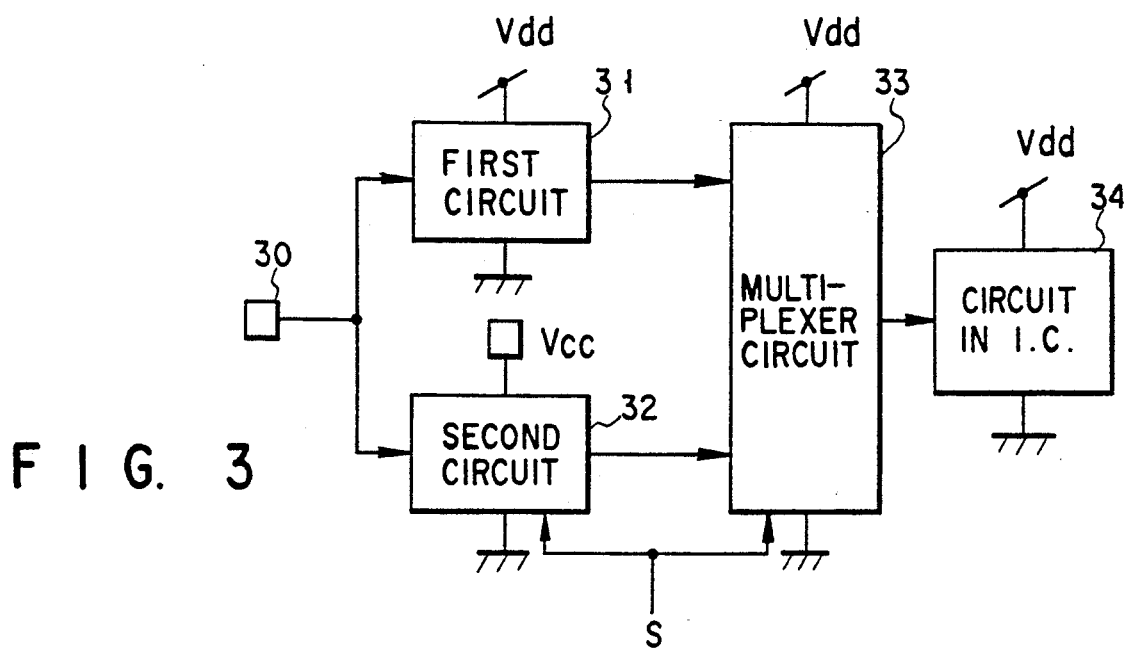
FIG. 3 is a block diagram showing the basic construction of a multimode input circuit of an LCD data driving IC.

FIG. 3 is a block diagram showing the basic construction of a multimode input circuit of an LCD data driving IC.

Figure 4:
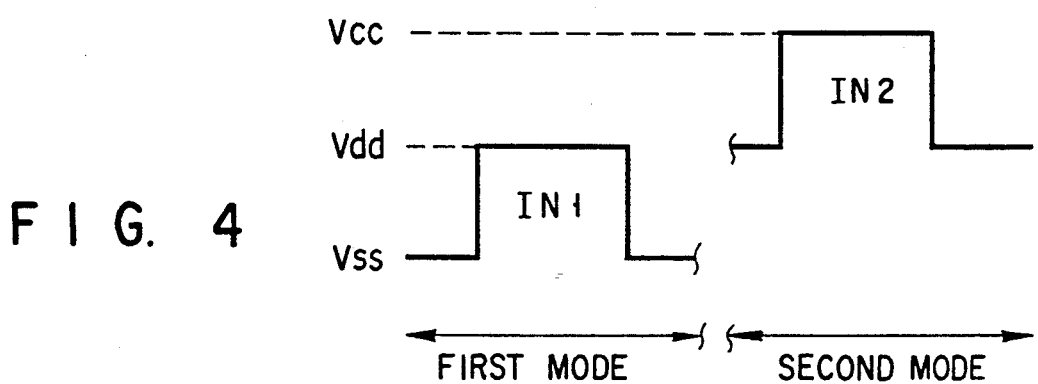
FIG. 4 is a waveform diagram showing an example of two input signals input to the input terminal of the multimode input circuit of FIG. 3.

FIG. 4 is a waveform diagram showing a first input signal IN1 and a second input signal IN2 which are input to an input terminal (pad) 30 shown in FIG. 3. The first input signal IN1 has an amplitude variation ranging from a first reference potential (circuit ground (GND) potential VSS) to a first power source potential Vdd. The second input signal IN2 has an amplitude variation ranging from a second reference potential (which is the first power source potential Vdd, for example) having an offset with respect to the first reference potential to a second power source potential Vcc.

A first input circuit 31 is used to detect the first input signal IN1 input to the input terminal 30 and is constructed by a normal CMOS logic circuit.

A second input circuit 32 is used to detect the second input signal IN2 input to the input terminal 30, convert the input signal to a signal having an amplitude variation ranging from the first reference potential VSS to the first power source potential Vdd and then output the converted signal. The second input circuit 32 is constructed by a ratio circuit so that the input amplitude may have a certain degree of freedom and is set into an operative state when a selection signal S is at a low level "L".

A multiplexer circuit 33 selects one of an output signal of the first input circuit 31 and an output signal of the second input circuit 32 and supplies the selected signal to an IC internal circuit 34.

Figure 5:
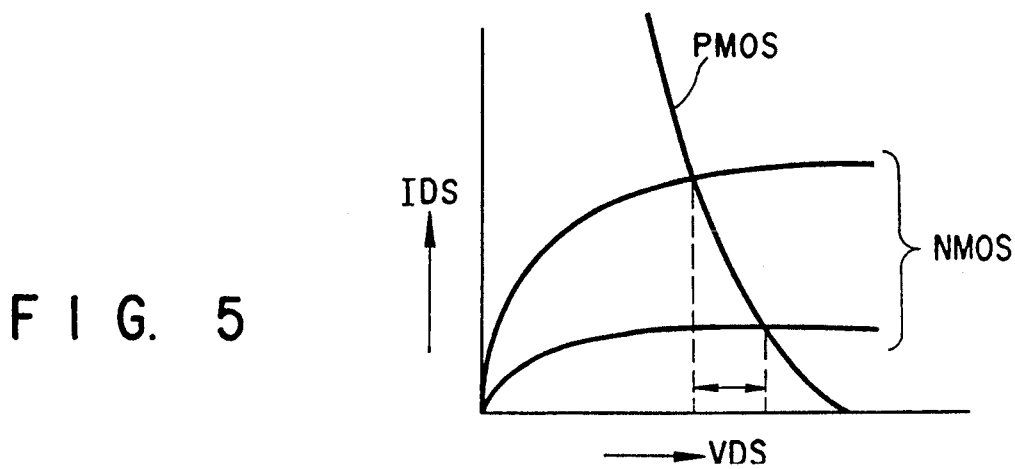
FIG. 5 is a characteristic diagram for illustrating the operation of a multimode input circuit to which this invention is not applied.

Since the second input circuit 32 of FIG. 3 uses a ratio circuit having a combination of the drain-source voltage/gate-source voltage (VDS/VGS) characteristics of a plurality of MOS transistors, the operation margin thereof is small as shown in FIG. 5.

Figure 1:
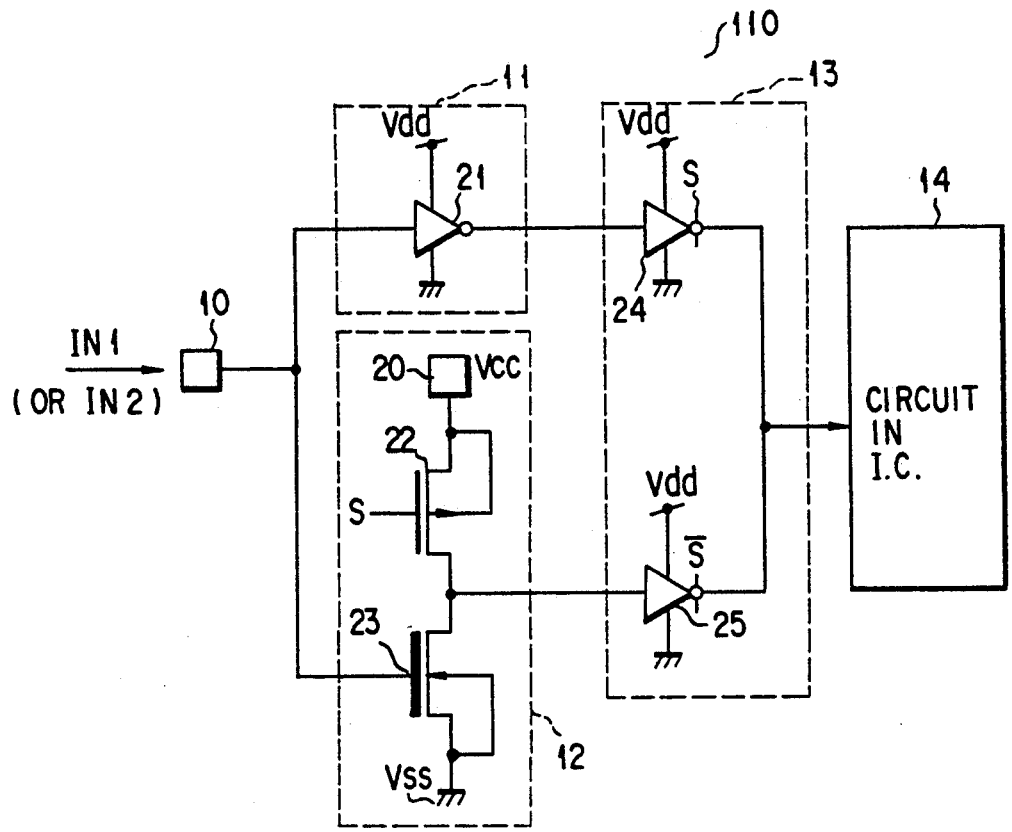
FIG. 1 is a circuit diagram showing one embodiment of a multimode input circuit according to this invention.

FIG. 1 shows a multimode input circuit provided in the LCD data driving IC according to one embodiment of this invention.

An input terminal 10 is connected to a first input circuit 11 for detecting a first input signal IN1 input to the input terminal 10 and having an amplitude variation ranging from a first reference potential (ground potential VSS) to a first power source potential Vdd and connected to a second input circuit 12 for detecting a second input signal IN2 input to the input terminal 10 and having an amplitude variation ranging from a second reference potential (which is the first power source potential Vdd, for example) to a second power source potential Vcc. A multiplexer 13 connected to the two input circuits selects one of an output signal of the first input circuit 11 and an output signal of the second input circuit 12 and supplies the selected signal to an IC internal circuit 14.

The first input circuit 11 is constructed by a CMOS inverter 21 supplied with the first power source potential Vdd as the operation power source potential.

The second input circuit 12 has a load MOS transistor 22 and an input MOS transistor 23 which are series-connected between the second power source potential Vcc and the ground potential VSS and respectively have the complementary conductivity types. The gate of the load MOS transistor 22 is supplied with the selection signal S and the input MOS transistor 23 is a high-withstand voltage logic FET. More specifically, the load P-channel MOS transistor 22 having the source and the substrate connected together and the input N-channel MOS transistor 23 having the source and the substrate connected together are series-connected between a second power source pad 20 to which the second power source potential Vcc is supplied and the ground potential Vss.

The multiplexer circuit 13 includes a first clocked gate circuit (for example, a clocked inverter circuit) 24 which is supplied with an output signal of the first input circuit 11 and whose operating condition is controlled by the selection signal S and a second clocked gate circuit (for example, a clocked inverter circuit) 25 which is supplied with an output signal of the second input circuit 12 and whose operating condition is controlled by a selection $\bar{S}$ which is an inverted form of the selection signal S and the output nodes of the two clocked gate circuits 24 and 25 are connected together.

Figure 2:
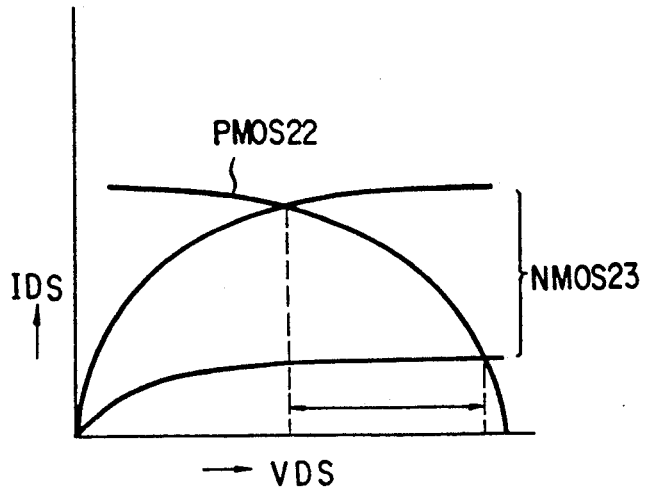
FIG. 2 is a characteristic diagram for illustrating the operation of the circuit of FIG. 1.

FIG. 2 is a characteristic diagram showing an example of the operation of the multimode input circuit of FIG. 1. In FIG. 2, VDS indicates the drain-source voltage of a MOS transistor and IDS indicates a current flowing in the MOS transistor.

Next, the operation of the multimode input circuit of FIG. 1 is explained.

Assuming now that the first input signal IN1 is input to the input terminal 10, then the selection signal S is set to an "H" level to activate the first clocked gate circuit 24 of the multiplexer circuit 13 so as to select the output of the first input circuit 11. At this time, the load P-channel MOS transistor 22 is set in the OFF state by the selection signal S so that no through current may flow in the second input circuit 12. Further, the output of the second input circuit 12 is set to the high impedance state, but the second clocked gate circuit 25 of the multiplexer circuit 13 is set in the OFF state so that no through current may flow.

On the other hand, when the second input signal IN2 is input to the input terminal 10, the selection signal S is set to the "L" level to activate the second clocked gate circuit 25 of the multiplexer circuit 13 so as to select the output of the second input circuit 12. At this time, the load P-channel MOS transistor 22 is set in the ON state by the selection signal S so that a current may flow in the second input circuit 12 when the input N-channel MOS transistor 23 is set in the ON state. Therefore, in order to suppress the current consumption to as small value as possible at this time, it is preferable to set the channel width W/channel length L of the load P-channel MOS transistor 22 to an optimum value. Further, the ratio of the dimensions of the load P-channel MOS transistor 22 and the input N-channel MOS transistor 23 is so determined that the second input circuit 12 may convert the second input signal IN2 to a signal having an amplitude variation ranging from the first reference potential Vss to the first power source potential Vdd when detecting the second input signal IN2 and output the converted signal.

According to the multimode input circuit of this embodiment described above, since the selection signal S is supplied to the gate of the load P-channel MOS transistor 22 to control the ON/OFF state thereof, the second input circuit 12 may be constructed with less number of through current preventing elements to attain substantially the same function as the conventional multimode input circuit. In this case, since the number of elements of high-withstand voltage structure required to be used in the second input circuit 12 can be reduced, the pattern area thereof can be reduced, the pattern area of the whole circuit can be reduced and the chip size of the integrated circuit can be reduced.

In the input circuit of this embodiment, the load P-channel MOS transistor 22 and input N-channel MOS transistor 23 of the second input circuit 12 are respectively controlled by the selection signal S and input signal IN2. Therefore, an amount of variation in the output voltage can be made larger with respect to a small variation in the input signal in comparison with a case of the conventional multimode input circuit so that the operation margin can be made large as shown in FIG. 2.

Figure 6:
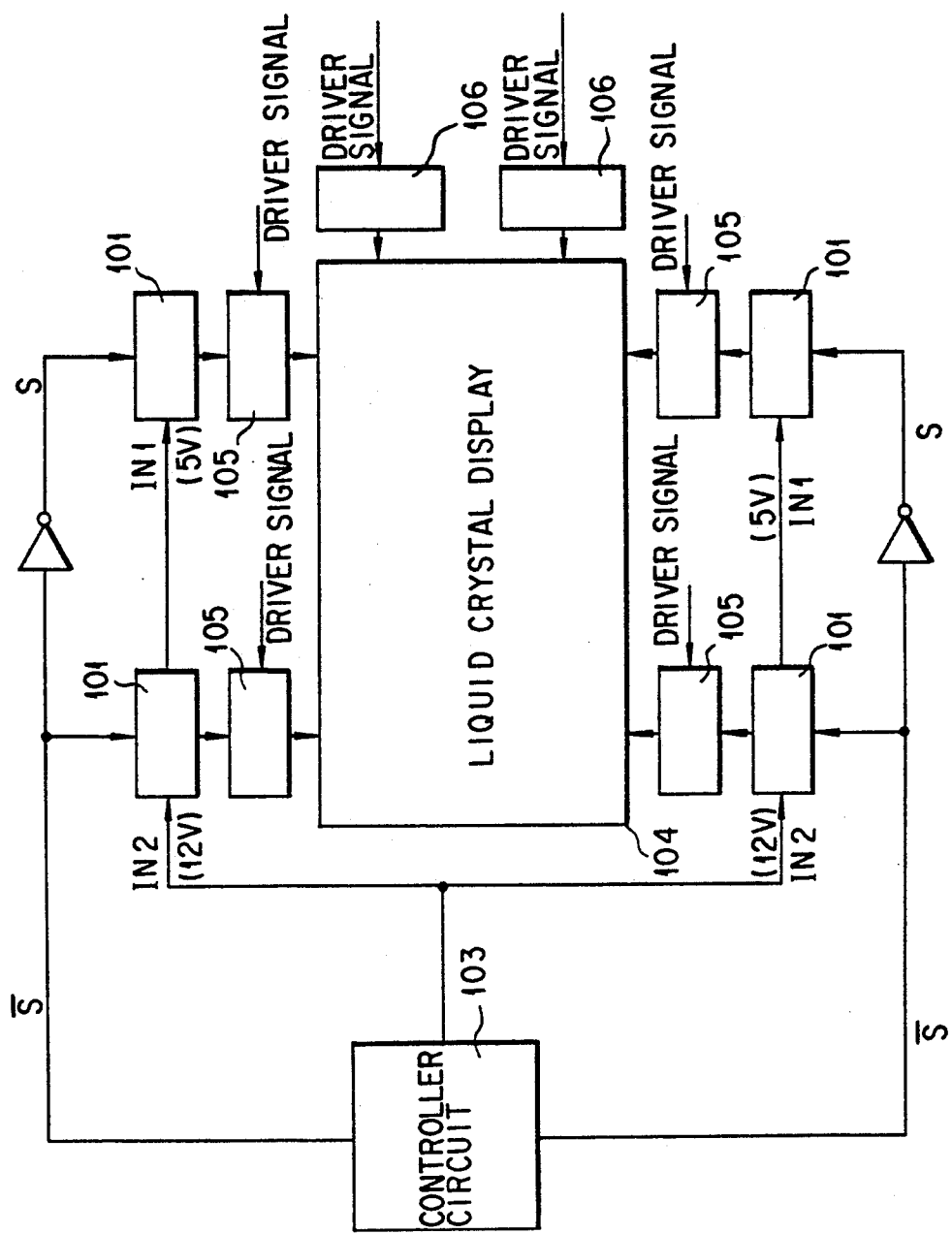
FIG. 6 and FIG. 7 are circuit diagrams showing an LCD having a plurality of multimode input circuits according to this invention and a peripheral circuit thereof.
Figure 7:
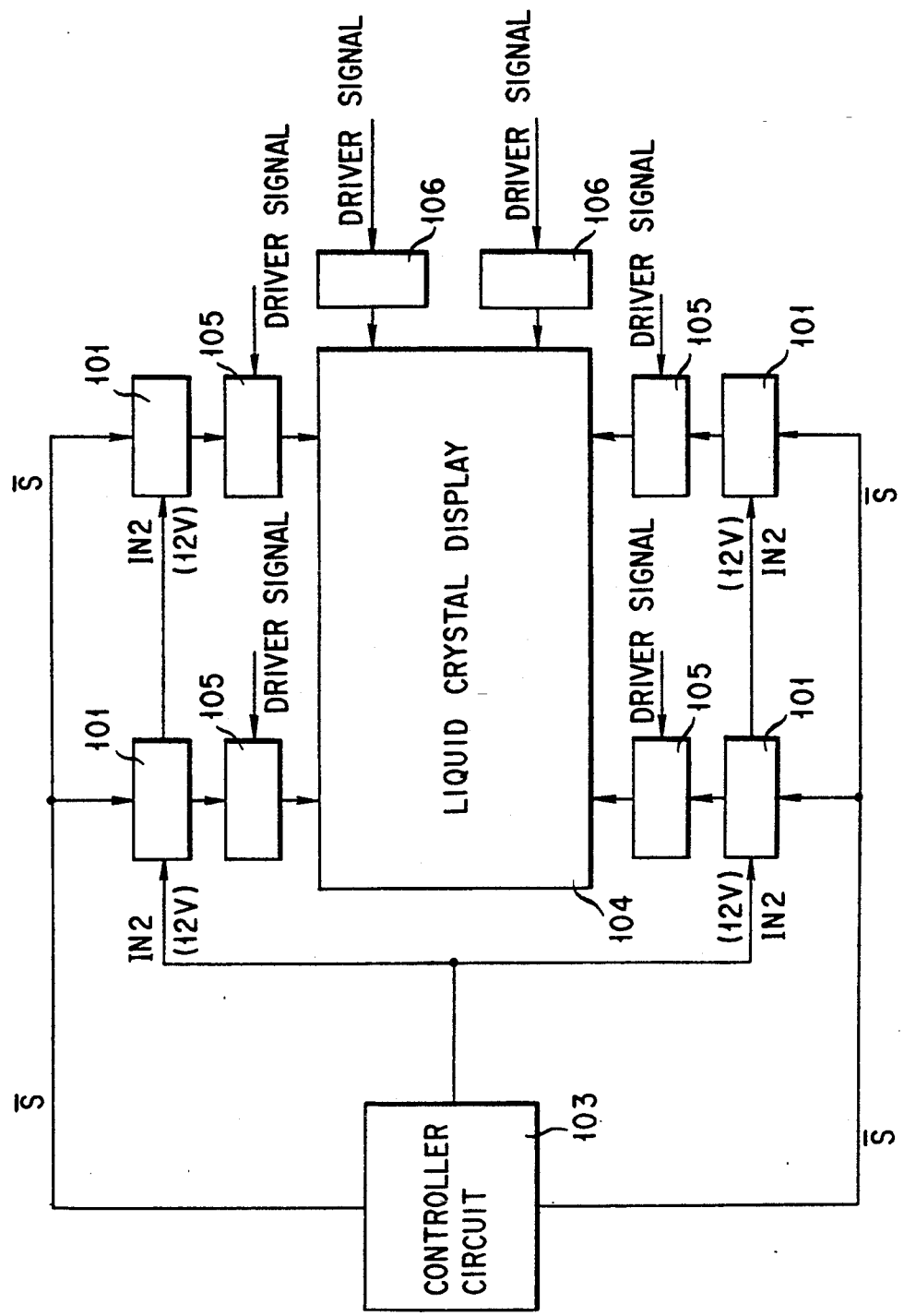

FIG. 6 and FIG. 7 are circuit diagrams showing an LCD having a plurality of multimode input circuits according to this invention and a peripheral circuit thereof. In the embodiment shown in FIG. 6, four X axis-direction drivers 105 which are supplied with digital driver signals from an image signal supplying circuit (not shown) are disposed around an LCD 104 and two Y axis-direction drivers 106 which are supplied with analog driver signals from an image signal supplying circuit are provided. The drivers 104 and 106 are connected to the LCD 104 to create an image. Multimode input circuits 101 of this invention are each provided for a corresponding one of the X axis-direction drivers 104 to supply signals for creating an image to the respective X axis-direction drivers. A controller circuit 103 supplies an image creating signal IN2 (which is a 12 V-system signal, for example) and signals S and S̄ for selecting the signals IN1 and IN2 to the multimode input circuit.

In the other embodiment of FIG. 7, a controller circuit 103 supplies only an image creating signal IN2 and signal S̄ for determining the signal IN2 voltage level operation.

It should be noted here that if the input circuits are series-connected around the LCD 104, one of the input circuits which is first supplied with a signal from the controller circuit 103 receives a 12 V-system signal and the succeeding stage input circuits receive a 5 V-system signal since they are supplied with an output signal from the first-stage input circuit. Therefore, it was necessary to design two different types of circuit patterns for the respective input circuits. However, by use of the multimode input circuits 101 of this invention, since the two signal levels can be determined by the selection signals S and S̄, a single circuit pattern may be used to deal with both of the signals.

Thus, it is not necessary to design input circuits exclusively used for respective signals and the cost for design can be reduced. Further, in the second output circuit 12, the complementary CMOS transistors 22 and 23 are used, and the FETs 22 and 23 are respectively designed to respond to the selection signal S and second signal IN2. As a result, the function of converting the second signal IN2 to the potential level of the first signal IN1 in response to the selection signal S can be attained with a minimum occupied area.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A multimode input circuit comprising:
    an input terminal;
    first outputting means, including a buffer circuit, for receiving a first signal having a first amplitude variation via the input terminal and outputting the first signal of a preset potential;
    second outputting means for receiving a second signal having a second amplitude variation different from the first amplitude variation via the input terminal and outputting third signal of a preset potential, the second outputting means including a power source supplying terminal for supplying the same potential as the maximum potential of the second signal, a first FET having a source connected to the power source supplying terminal, a gate supplied with a selection signal for specifying one of the input signals to be selected by the multimode input circuit and a drain, and a second FET formed to make a complementary structure together with the first FET and having a drain connected to the drain of the first FET, a gate connected to the input terminal and a source connected to a circuit ground; and
    selecting means for receiving the first and third signals from the first and second outputting means and a selection signal from the exterior and selecting and outputting one of the first and third signals according to the state of the selection signal.

2. A multimode input circuit according to claim 1, wherein the third signal is a digital signal having substantially the same amplitude variation as that of the first signal and having the same logic value as the second signal.

3. A multimode input circuit according to claim 1, wherein the second FET is a high-withstand voltage logic FET.

4. A multimode input circuit according to claim 1, wherein the selecting means includes a first gate circuit which is activated by the selection signal, for receiving a first signal output from the first outputting means and a second gate circuit which is activated when the selection signal is set in an inverted form of the first gate signal, for receiving the third signal from the second outputting means.

5. A multimode input circuit according to claim 1, wherein the amplitude of the first signal is 5 V and the amplitude of the second signal is 12 V.

6. A multimode input circuit comprising:
    an input terminal;
    first outputting means including a buffer circuit, for receiving a first signal having an amplitude variation of 5 V via the input terminal and outputting the first signal of a preset potential;
    second outputting means for receiving a second signal having an amplitude variation of 12 via the input terminal and outputting a digital signal as a third signal having an amplitude variation of 5 V and having the same logic value as the second signal, the second outputting means including a power source supplying terminal of 12 V, a first FET having a source connected to the power source supplying terminal, a gate supplied with a selection signal for specifying one of the input signals to be selected by the multimode input circuit and a drain, and a second FET formed to make a complementary structure together with the first FET and having a drain connected to the drain of the first FET, a gate connected to the input terminal and a source connected to a circuit ground; and
    selecting means for receiving the first and third signals from the first and second outputting means and a selection signal from the exterior and selecting and outputting one of the first and third signals according to the state of the selection signal, the selecting means including a first gate circuit which is activated by the selection signal, for receiving the first signal output from the first outputting means and a second gate circuit which is activated when the selection signal is set in an inverted form of the first gate signal, for receiving the third signal from the second outputting means.

7. A liquid crystal display system comprising:
a liquid crystal display;
means for generating signals for operating the liquid crystal display;
a plurality of means connected to the liquid crystal display, for driving the liquid crystal display; and
a plurality of multimode input circuits respectively connected to the plurality of driving means and having:
an input terminal connected to the generating means;
first outputting means including a buffer circuit, for receiving a first signal having an amplitude variation of 5 V via the input terminal and outputting the first signal of a preset potential;
second outputting means for receiving a second signal having an amplitude variation of 12 V via the input terminal and outputting a digital signal as a third signal having an amplitude variation of 5 V and having the same logic value as the second signal, the second outputting means including a power source supplying terminal of 12 V, a first FET having a source connected to the power source supplying terminal, a gate supplied with a selection signal for specifying one of the input signals to be selected by the multimode input circuit and a drain, and a second FET formed to make a complementary structure together with the first FET and having a drain connected to the drain of the first FET, a gate connected to the input terminal and a source connected to a circuit ground; and
selecting means for receiving the first and third signals from the first and second outputting means and a selection signal from the exterior and selecting and outputting one of the first and third signals according to the state of the selection signal, the selecting means including a first gate circuit which is activated by the selection signal, for receiving the first signal output from the first outputting means and a second gate circuit which is activated when the selection signal is set in an inverted form of the first gate signal, for receiving the third signal from the second outputting means.

* * * * *